(12) United States Patent
Jung et al.

(10) Patent No.: US 7,195,977 B2
(45) Date of Patent: Mar. 27, 2007

(54) METHOD FOR FABRICATING A SEMICONDUCTOR DEVICE

(75) Inventors: Sung Mun Jung, Kyungki-do (KR); Dong Oog Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/954,484

(22) Filed: Oct. 1, 2004

(65) Prior Publication Data

US 2005/0074940 A1  Apr. 7, 2005

(30) Foreign Application Priority Data

Oct. 1, 2003  (KR) .................. 10-2003-0068492

(51) Int. Cl.
*H01L 21/336*  (2006.01)
(52) U.S. Cl. .................. 438/262; 438/299; 438/302; 438/525
(58) Field of Classification Search .......... 438/299, 438/302, 257, 262, 525
See application file for complete search history.

(56) References Cited

U.S. PATENT DOCUMENTS

| 5,103,274 | A | | 4/1992 | Tang et al. |
| 5,120,671 | A | | 6/1992 | Tang et al. |
| 5,547,884 | A | * | 8/1996 | Yamaguchi et al. ........ 438/297 |
| 6,265,292 | B1 | * | 7/2001 | Parat et al. .................. 438/524 |
| 6,413,843 | B1 | * | 7/2002 | Hara .......................... 438/525 |
| 6,596,586 | B1 | * | 7/2003 | Yang et al. ................. 438/257 |
| 6,740,918 | B2 | * | 5/2004 | Ooi ............................ 257/296 |

FOREIGN PATENT DOCUMENTS

| KR | 10-2000-0043890 A | 7/2000 |
| KR | 10-2002-0074336 A | 9/2002 |

* cited by examiner

*Primary Examiner*—Trung Dang
(74) *Attorney, Agent, or Firm*—Finnegan, Henderson, Farabow, Garrett, & Dunner, L.L.P.

(57) ABSTRACT

A method for fabricating the semiconductor device includes forming linear field oxide regions on a semiconductor substrate; forming gate oxide lines on the semiconductor substrate between the field oxide regions; forming gate lines on the field oxide regions and the gate oxide lines, the gate lines being substantially perpendicular to the field oxide regions; etching the gate oxide lines and the field oxide regions between the gate lines; and forming a self-aligned source (SAS) region by injecting impurity ions into the etched regions, the impurity ion being injected in a direction at a predetermined angle other than 90° relative to the semiconductor substrate.

14 Claims, 3 Drawing Sheets

METHOD FOR FABRICATING A SEMICONDUCTOR DEVICE

RELATED APPLICATION

This application is related to and claims priority to Korean Patent Application No. 10-2003-0068492, filed on Oct. 1, 2003, the entire contents of which are expressly incorporated herein by reference.

BACKGROUND (a) Technical Field

The present invention relates to a method for fabricating a semiconductor device and, in particular, to a process for forming trenches with different depths in cell and boundary regions so as to reduce SAS (self-aligned source) resistance at the cell region.

(b) Description of Related Art

Recently, with the wide applications of flash memories and growing competition in prices thereof, various technologies have been developed to reduce the sizes of the memory devices. One such technology is a self-aligned source (SAS) technique.

The SAS technique is a method for reducing the cell size in a bit line direction and was described in U.S. Pat. Nos. 5,120,671 and 5,103,274. The SAS technique is essentially adopted for below-0.25 µm line width technology. Because the SAS technology can reduce a gap between the gate and the source of a transistor, the size of a memory cell can be reduced by about 20% with the introduction of the SAS technique.

However, the conventional SAS technique has a drawback in that junction resistance of the source per cell dramatically increases because the SAS region is formed along a trench profile.

Moreover, the SAS technique has another drawback in that the actual resistivity at a sidewall of a trench, which is a boundary region between the trench region and an active region, is much greater than and may be about 10 times as much as that at the horizontal surfaces of the trench and active regions, because the depth and amount of the implantation of the injected impurity ions in the sidewall are smaller than those in the other regions, such as the horizontal surfaces of the trench and the active regions.

SUMMARY

It is desirable to provide a method for fabricating a semiconductor device with the SAS technique, which has a reduced resistance.

It is also desirable to provide a method for fabricating a semiconductor device, which is capable of reducing the resistivity along sidewalls of an SAS region.

Consistent with an embodiment of the present invention, there is provided method for fabricating the semiconductor device that includes forming linear field oxide regions on a semiconductor substrate; forming gate oxide lines on the semiconductor substrate between the field oxide regions; forming gate lines on the field oxide regions and the gate oxide lines, the gate lines being substantially perpendicular to the field oxide regions; etching the gate oxide lines and the field oxide regions between the gate lines; and forming a self-aligned source (SAS) regions by injecting impurity ions into the etched regions, the impurity ion being injected in a direction at a predetermined angle other than 90° relative to the semiconductor substrate.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to exemplary embodiments of the invention, examples of which are illustrated in the accompanying drawings. Wherever possible, the same reference numbers will be used throughout the drawings to refer to the same or like parts.

The SAS technique is for reducing the size of a memory cell in the bit line direction by decreasing a gap between a gate and a source of transistors. The SAS technique is an essential process for devices with a below–0.25 µm line.

Typically, a NOR type flash memory utilizes a common source and one source contact is formed per 16 memory cells.

Figure 1A:
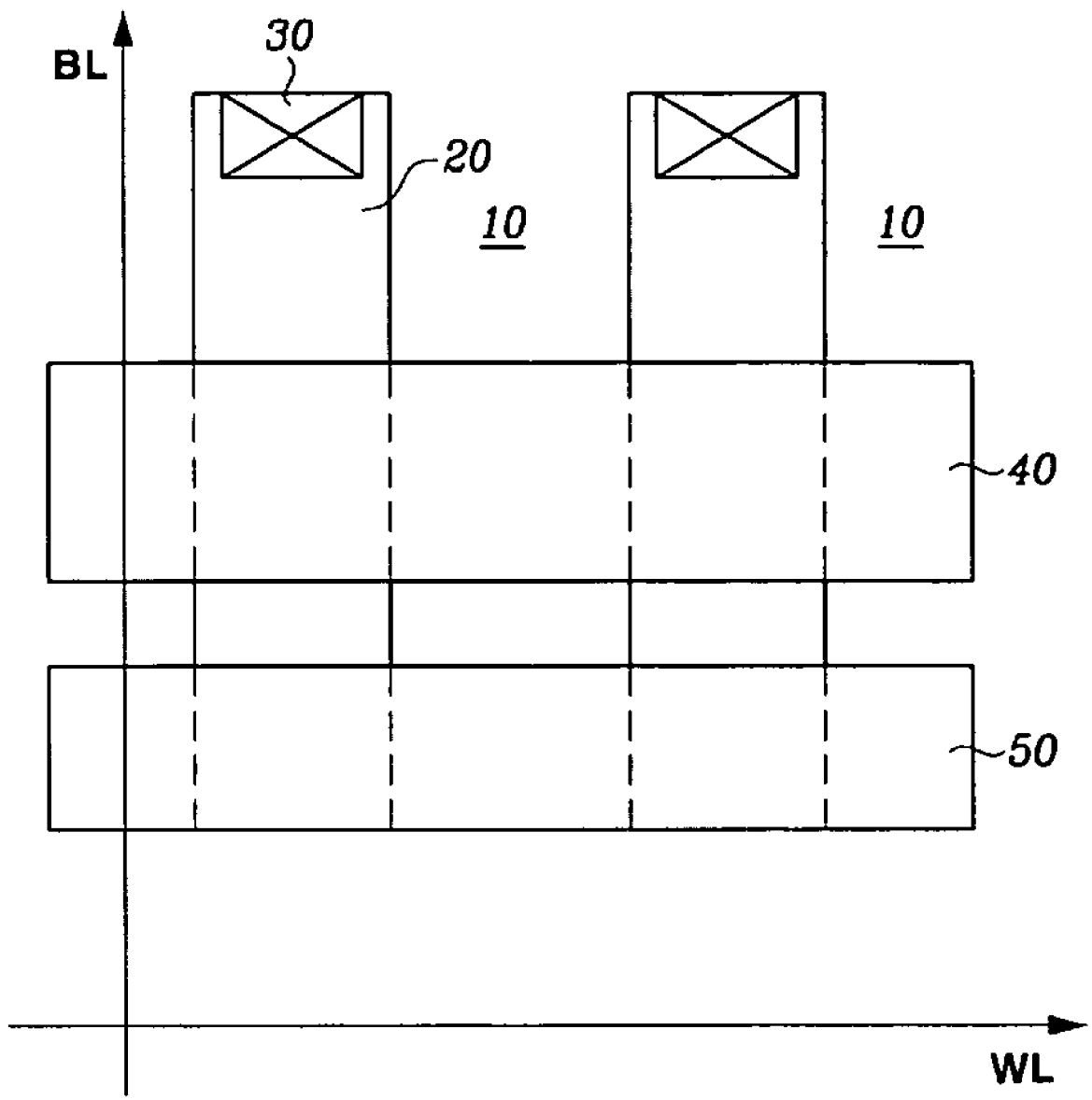
FIG. 1A is a plan view illustrating a conventional memory cell without introducing the SAS technique.
Figure 1B:
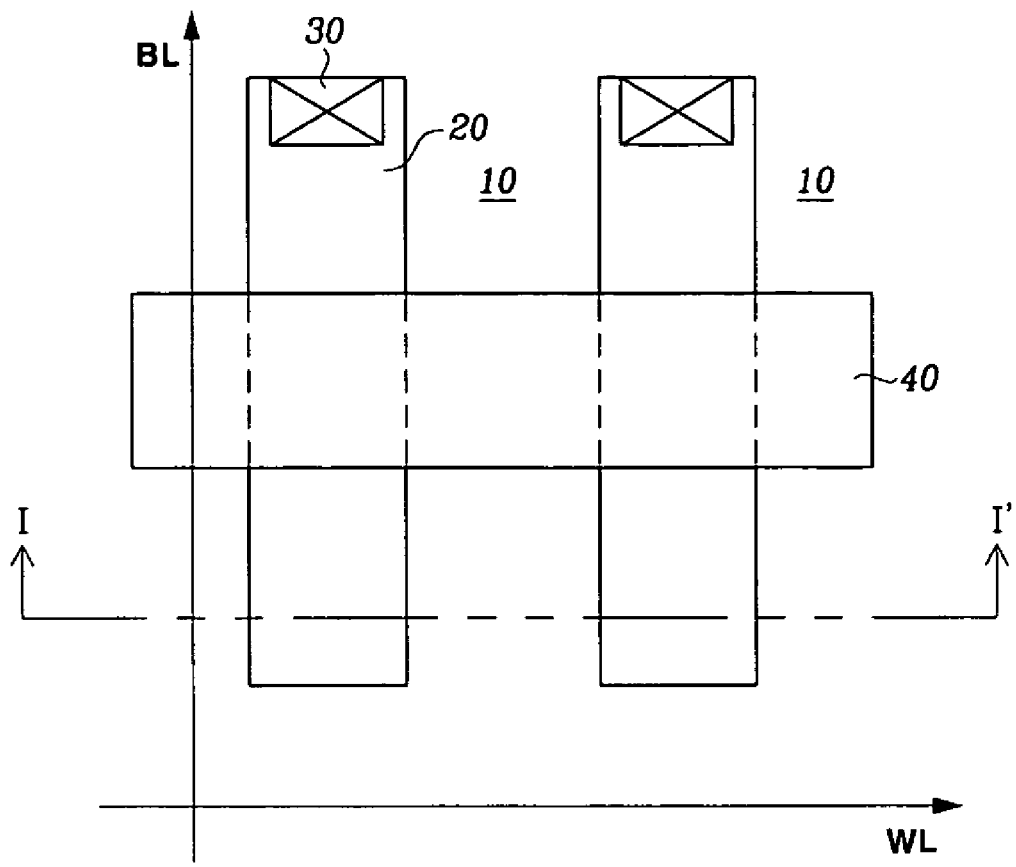
FIG. 1B is a plan view illustrating a memory cell fabricated with the SAS technique.
Figure 1C:
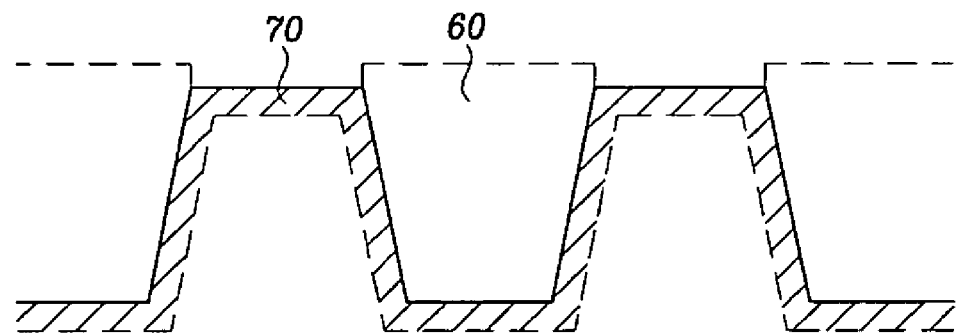
FIG. 1C is a cross sectional view of the memory cell of FIG. 1B taken along line I–I'.

FIG. 1A is a plan view illustrating a conventional memory cell without introducing the SAS technique, FIG. 1B is a plan view illustrating a memory cell fabricated with the SAS technique, and FIG. 1C is a cross sectional view taken along line I–I' in FIG. 1B.

In FIG. 1A, field oxide regions 10 as device isolation regions are formed in a semiconductor substrate in a bit line (BL) direction, and active regions 20 for forming devices are defined between field oxide regions 10. A drain contact 30 is formed for each cell formed in the active region 20.

A plurality of gate lines 40 are formed in a word line (WL) direction, and a plurality of common source lines 50 are formed in parallel with gate lines 40 at a predetermined distance therefrom. Only one gate line 40 and one common source line 50 are shown in FIG. 1A.

By introducing the SAS technique for forming the memory cell 1, an SAS region 70 is formed by injecting impurity ions in a region which corresponds to common source line 50 after etching a plurality of field oxide trenches 60 in the semiconductor substrate, as shown in FIG. 1B and FIG. 1C. Oxide is then deposited in field oxide trenches 60 to form field oxide regions 10.

Because SAS region 70 is formed along the trench profile of trenches 60 and because the actual surface resistance is proportional to a surface length of the SAS region 70, the junction resistance of the source per cell increases dramatically.

Also, the resistivity at the sidewalls of trenches 60 is greater than that at the horizontal surfaces of trenches 60, because the depth and amount of the implantation of the injected impurity ions in the sidewalls are smaller than those in the horizontal surfaces.

Figure 2:
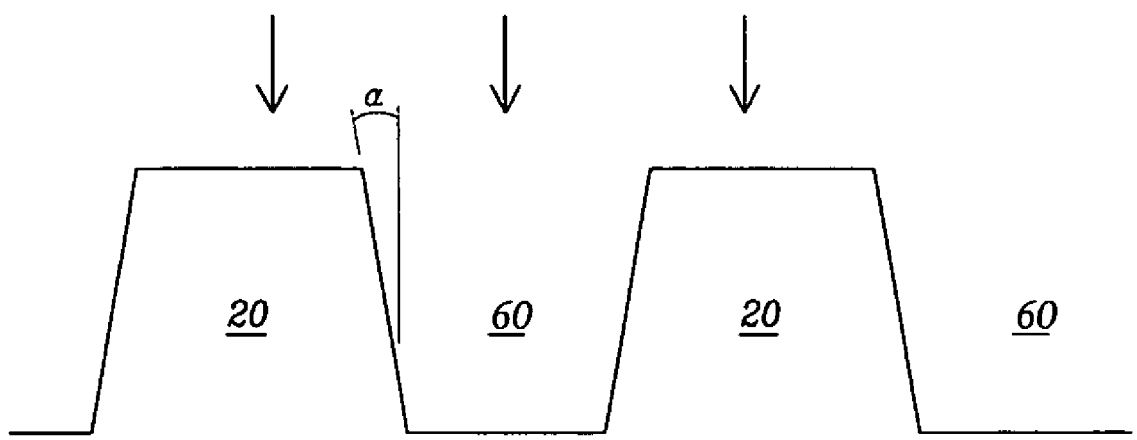
FIG. 2 is a cross sectional view for illustrating a conventional impurity ion implanting process for forming the SAS region.

FIG. 2 is a cross sectional view illustrating the impurity ions injection process for forming SAS region 70. As shown in FIG. 2, the ion injection is carried out in a vertical direction relative to the substrate. Therefore, the impurity ions are vertically injected to the horizontal surfaces of field oxide regions 10 and active regions 20 so as to form a heavily doped contact layer thereon.

However, on the sidewalls of trenches 60, which are the boundary between field oxide regions 10 and active regions 20, the impurity ions are injected at an angle of $\alpha$, as shown in FIG. 2. The injection energy and amount of impurity ions injected into each of the sidewalls of trenches 60 are proportional to sine $\alpha$. Accordingly, the resistivity at the sidewalls is much greater than and may be 10 times as much as that at the horizontal surfaces of trenches 60 and active region 20.

Figure 3:
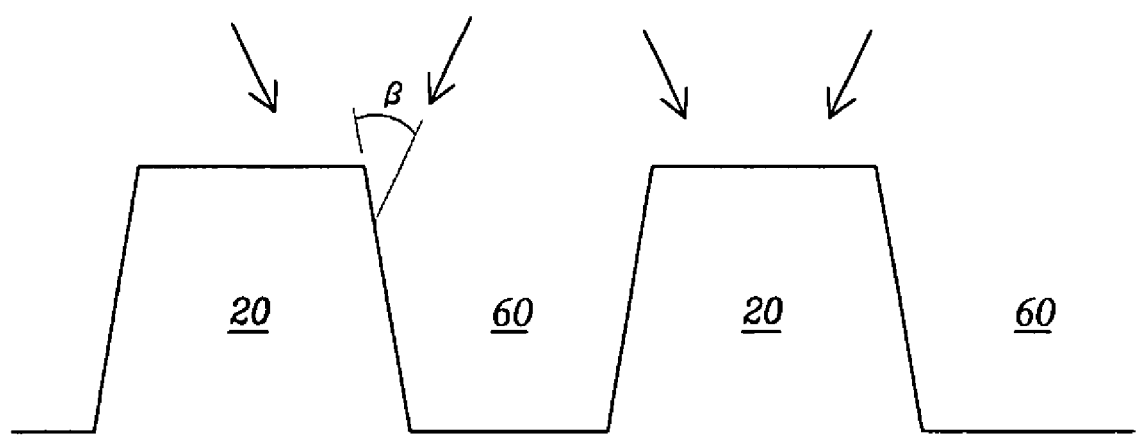
FIG. 3 is a schematic view for illustrating an impurity ions implantation process consistent with an embodiment of the present invention.

Consistent with an embodiment of the present invention, the impurity ions may be injected or implanted at a predetermined tilted angle, i.e., an angle other than 90°, relative to the semiconductor substrate, as shown in FIG. 3.

In FIG. 3, the impurity ions are injected onto the sidewalls of trenches 60 at an angle of $\beta$ and are injected onto the horizontal surfaces of trenches 60 and active region 20 at an angle less than 90°, wherein $\beta$ is greater than angle $\alpha$. Thus, the impurity ions are injected at substantially the same amount and depth on both the horizontal surfaces of trenches 60 and active regions 20 and the sidewalls of trenches 60, resulting in uniform resistivity of the SAS region.

The method for fabricating a semiconductor device consistent with an embodiment of the present invention will be described in detail.

First, linear trench lines, that is, field oxide regions, are formed on a semiconductor substrate. The trench lines may be formed in parallel with a bit line direction.

Next, gate oxide lines are formed on the semiconductor substrate between the trench lines.

Next, gate lines are formed on the trench lines and the gate oxide lines in a direction perpendicular to the trench lines, i.e., in parallel with a word line direction. Each of the gate lines may comprise a polycrystalline silicon layer. The gate lines may also be a flash memory type and each may comprise a first polycrystalline silicon layer, a composite dielectric layer such as oxide-nitride-oxide (ONO) layer, and a second polycrystalline silicon layer.

Next, the gate oxide lines and the trench lines between the gate lines are etched. The etching process may be carried out by using a mask exposing portions of the gate lines between the gate lines. In one aspect, the insulating material composing the trench lines, for example, an oxide layer, has a higher etching rate, or, is etched at a faster speed, than the semiconductor substrate.

Next, self-aligned source (SAS) regions are formed by injecting impurity ions into the etched regions. The impurity ions are injected at a tilted angle relative to the semiconductor substrate. Particularly, the impurity ions are injected at a direction that is tilted at a positive and a negative angle with respect to the semiconductor substrate and is in a plane parallel with the gate lines such that half of the impurity ions are injected at a positive angle direction and the other half of the impurity ions is injected in a negative angle direction, wherein the positive angle is greater than 90° and the negative angle is less than 90°. In one aspect, the positive angle or the negative angle is equal to or greater than 20°. In another aspect, the positive angle or the negative angle is equal to or less than 55°. In one aspect, the impurity ions are arsenic (As) ions. In another aspect, phosphorous P ions may be further injected, either in a vertical direction or in a direction at the predetermined tilted angle. In one aspect, the injected amount of As ions is in a range of $5\times10^{14}$~$5\times10^{15}$/cm$^3$ and the amount of the injected P ions is in a range of $1\times10^{14}$~$5\times10^{14}$/cm$^3$.

The memory device formed using a method consistent with embodiments of the present invention as described above has a reduced resistance at an SAS region.

Also, consistent with the present invention, because impurity ions are uniformly injected both in amount and in depth over the entire SAS region including the sidewalls of the trenches and the horizontal surfaces thereof, the resistivity of the entire SAS region is uniform, resulting in improved characteristics, such as a punch-through characteristic, of the memory device.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a semiconductor device, comprising:

forming linear field oxide regions on a semiconductor substrate;

forming gate oxide lines on the semiconductor substrate between the field oxide regions;

forming gate lines on the field oxide regions and the gate oxide lines, wherein the gate lines extend in a direction perpendicular to the field oxide regions;

etching the gate oxide lines and the field oxide regions between the gate lines to form trenches, wherein a width of a top of the trenches is greater than a width of a bottom of the trenches; and forming a self-aligned source (SAS) region by injecting impurity ions into the trenches, the impurity ion being injected in a direction at a predetermined angle other than 90° relative to the semiconductor substrate.

2. The method of claim 1, wherein the impurity ions are injected in a direction at both a positive and a negative angle with respect to the semiconductor substrate and in a plane parallel with the gate line, wherein the positive angle is greater than 90° and the negative angle is less than 90°.

3. The method of claim 2, wherein half of the impurity ions are injected in a positive angle direction and the other half of the impurity ions are injected in a negative angle.

4. The method of claim 1, wherein the impurity ions are injected in a direction at an angle equal to or greater than 20° relative to the semiconductor substrate.

5. The method of claim 4, wherein the angle is in a range of 20°~55°.

6. The method of claim 1, wherein the impurity ions are arsenic (As) ions.

7. The method of claim 6, further comprising injecting phosphorous (P) ions in a vertical or tilted direction relative to the semiconductor substrate after the As ions are injected.

8. The method of claim 6, wherein the amount of As ions injected is in a range of $5 \times 10^{14} \sim 5 \times 10^{15}/cm^3$.

9. The method of claim 7, wherein the amount of P ions injected is in a range of $1 \times 10^{14} \sim 5 \times 10^{14}/cm^3$.

10. The method of claim 1, wherein the field oxide regions are substantially parallel to a bit line of the device and the gate lines are substantially parallel to a word line of the device.

11. The method of claim 1, wherein etching the gate oxide lines is performed using a mask exposing portions of the gate lines between the gate lines.

12. The method of claim 1, wherein etching the gate oxide lines is carried out under a condition in that an etching speed of the field oxide regions is faster than an etching speed of the semiconductor substrate.

13. The method of claim 12, wherein the field oxide regions comprise an oxide layer.

14. The method of claim 1, wherein the gate lines comprise a first polycrystalline silicon layer, a dielectric layer, and a second polycrystalline silicon layer.

* * * * *